(12) United States Patent
Lue

(10) Patent No.: US 6,998,671 B2
(45) Date of Patent: Feb. 14, 2006

(54) LOCALIZED SPLIT FLOATING GATE DEVICE USING DRAIN COUPLING TO SUPPRESS THE SECOND BIT EFFECT

(75) Inventor: Hang-Ting Lue, Hsinchu (TW)

(73) Assignee: Macronix International Co., Ltd., (TW)

( * ) Notice: Subject to any disclaimer, the term of this patent is extended or adjusted under 35 U.S.C. 154(b) by 0 days.

(21) Appl. No.: 10/824,840

(22) Filed: Apr. 14, 2004

(65) Prior Publication Data

US 2005/0230737 A1 Oct. 20, 2005

(51) Int. Cl.
*H01L 29/788* (2006.01)
(52) U.S. Cl. .................... 257/315; 257/314; 257/316; 257/320; 257/321; 257/322; 257/326
(58) Field of Classification Search .............. None
See application file for complete search history.

(56) References Cited

U.S. PATENT DOCUMENTS 5,877,523 A * 3/1999 Liang et al. ............... 257/315
6,624,025 B1 * 9/2003 Hsieh et al. ............... 438/258

* cited by examiner

*Primary Examiner*—Andy Huynh
(74) *Attorney, Agent, or Firm*—Martine Penilla & Gencarella, LLP

(57) ABSTRACT

The present invention provides a method for using drain coupling to suppress the second bit effect of localized split floating gate devices. By suitably designing the gate and drain overlap region, the drain coupling coefficient can be controlled to effectively suppress the second bit effect during a reverse read operation. The modified reverse read method such as the "raised source voltage $V_S$" method can also be employed to further improve the drain coupling effect without read disturb. Furthermore, the drain coupling can improve the channel hot electron (CHE) injection efficiency.

21 Claims, 3 Drawing Sheets

LOCALIZED SPLIT FLOATING GATE DEVICE USING DRAIN COUPLING TO SUPPRESS THE SECOND BIT EFFECT

BACKGROUND OF THE INVENTION

1. Field of the Invention

The present invention relates generally to a semiconductor device, and more particularly, to a method of using drain coupling to suppress the second bit effect of localized split floating gate devices with two-bit operation capability.

2. Description of the Related Art

The use of semiconductor devices with multiple bit operation capability leads to reduce the volume occupied by the devices and produce dense semiconductor structures. FIG. 1 illustrates a cross-sectional view of a conventional floating gate Nitride Read Only Memory (NROM) cell with two bits operation capability. The NROM cell 100 includes a P-well substrate 110 with doped source 120 and drain 130. A silicon nitride layer 150 is sandwiched between two oxide layers 140 and 160 which are disposed over the substrate 110. A gate conductor 170 is disposed over the oxide layer 160, and a channel 115 is formed under the oxide layer 140 between drain 130 and source 120.

A NROM cell can be electrically programmed, read, and erased. The programming of the NROM cell 100 generates hot electrons in the channel 115. A fraction of these hot electrons gain enough energy to surmount the barrier of the oxide layer 140 and become trapped in the silicon nitride layer 150. The trapped charge will move to the region in the layer 150 near drain 130. Since the silicon nitride layer 150 is non-conductive, the NROM cell 100 can be programmed to have hot charges gathered at both ends of the layer 150 by interchanging the role of the source/drain terminal. The stored charge at the left end of the layer 150 is considered as the bit-1 180 whereas the stored charge at the right end of the layer 150 is considered as the bit-2 190.

When a NROM cell is read, the presence or absence of stored charge is determined by sensing the change is its threshold voltage Vt. The more the stored charge, the higher the threshold voltage Vt. The two bits operation of the NROM cell 100 can be realized by using a reverse read scheme, which is performed in the reverse direction compared to the programming.

The second bit effect, the unique phenomenon in a two-bit storage memory cell is caused by the interaction between the bit-1 180 and the bit-2 190 during a reverse read operation. As shown in FIG. 1, a read voltage Vread is applied to the drain terminal when the bit-1 180 of the NROM cell 100 is read using the reverse read scheme. If the bit-1 180 and the bit-2 190 are programmed to low threshold voltages, the potential barrier created by the bit-2 190 while reading the bit-1 180 can be screened out by a suitable Vread. Thus, the bit-1 180 can be read successfully. However, if the bit-2 190 is programmed to a high threshold voltage state and the bit-1 180 is retained at a low threshold voltage state, as the threshold voltage of the bit-2 190 increases, the read voltage Vread for the bit-1 180 becomes insufficient to overcome the potential barrier created by the bit-2 190. Consequently, the threshold voltage of the bit-1 180 is pulled up as a result of the increasing threshold voltage of the bit-2 190. This phenomenon is called the second bit effect.

The second bit effect is a severe problem for a two-bit semiconductor device because it decreases the read sense margin and makes the multiple level cell (MLC) operation difficult to operate. In addition, the second bit effect causes the degradation of the sub-threshold swing.

In view of the foregoing, there is a need for a method of suppressing the second bit effect for a two-bit semiconductor device during its reverse read operation.

SUMMARY OF THE INVENTION

Broadly speaking, the present invention fills this need by providing a method of using drain coupling to suppress the second bit effect of localized floating gate devices with split gate structures. Because the control gate is located above the channel center for a localized split floating gate device, the drain coupling will not cause the drain to turn on for an un-selected device. By suitably designing the gate and drain overlap region, the drain coupling coefficient can be controlled to effectively suppress the second bit effect. As a result, the read sense margin can be largely improved and the multiple level cell (MLC) operation is more feasible. The coupled gate voltage due to the drain coupling can also pull the inversion channel upward and restore the sub-threshold swing. The recovered sub-threshold swing helps to improve the device performance. The modified reverse read scheme, i.e., the "raised source voltage $V_S$" scheme can be employed to further improve the drain coupling effect. Furthermore, the drain coupling of a localized split gate device can also improve the channel hot electron (CHE) injection efficiency.

In one embodiment, a localized split floating gate device is disclosed. The localized split floating gate device includes a substrate having a first source-drain junction and a second source-drain junction. Also included are a first oxide region defined over the first source-drain junction and a second oxide region defined over the second source-drain junction. A first floating gate is defined with an overlap over the first source-drain junction and adjacent to the first oxide region. The overlap is capable of establishing a degree of drain coupling when the first source-drain junction is wired as a drain. A second floating gate is defined with an overlap over the second source-drain junction and adjacent to the second oxide region. The overlap is capable of establishing a degree of drain coupling when the second source-drain junction is wired as a drain.

In another embodiment, a localized split floating gate device is disclosed. The localized split floating gate device includes a drain junction defined in a substrate and an oxide region defined over a center region of the drain junction. Also included is a floating gate defined adjacent to the oxide region and with an overlap over the drain junction. The overlap is capable of establishing a degree of drain coupling to suppress a reverse read second bit effect.

In yet another embodiment, a method for making a localized split floating gate device having second bit effect suppression in a reverse read operation is provided. In this method, a substrate having a first source-drain junction and a second source-drain junction is provided. A first oxide region is formed over the first source-drain junction and a second oxide region is formed over the second source-drain junction. A first floating gate is formed with an overlap over the first source-drain junction and adjacent to the first oxide region. The overlap is capable of establishing a degree of drain coupling when the first source-drain junction is wired as a drain. A second floating gate is formed with an overlap over the second source-drain junction and adjacent to the second oxide region. The overlap is capable of establishing a degree of drain coupling when the second source-drain junction is wired as a drain.

In still another embodiment, a method for making a localized split floating gate device having second bit effect suppression in a reverse read operation is provided. In this method, a drain junction is formed in a substrate and an oxide region is formed over a center region of the drain junction. A floating gate is formed adjacent to the oxide region and with an overlap over the drain junction. The overlap is capable of establishing a degree of drain coupling to suppress a reverse read second bit effect.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Normally, the drain coupling coefficient is not a desired parameter in floating gate devices because the drain coupling will cause the drain to turn ON when the gate voltage is less than the threshold voltage. The drain coupling can also cause bit line disturb in a floating gate device. However, when a device has a split floating gate structure with a control gate above the channel center, the drain coupling will not cause the drain to turn-on because the control gate can turn-off the channel current for an un-selected split floating gate device.

Figure 1:
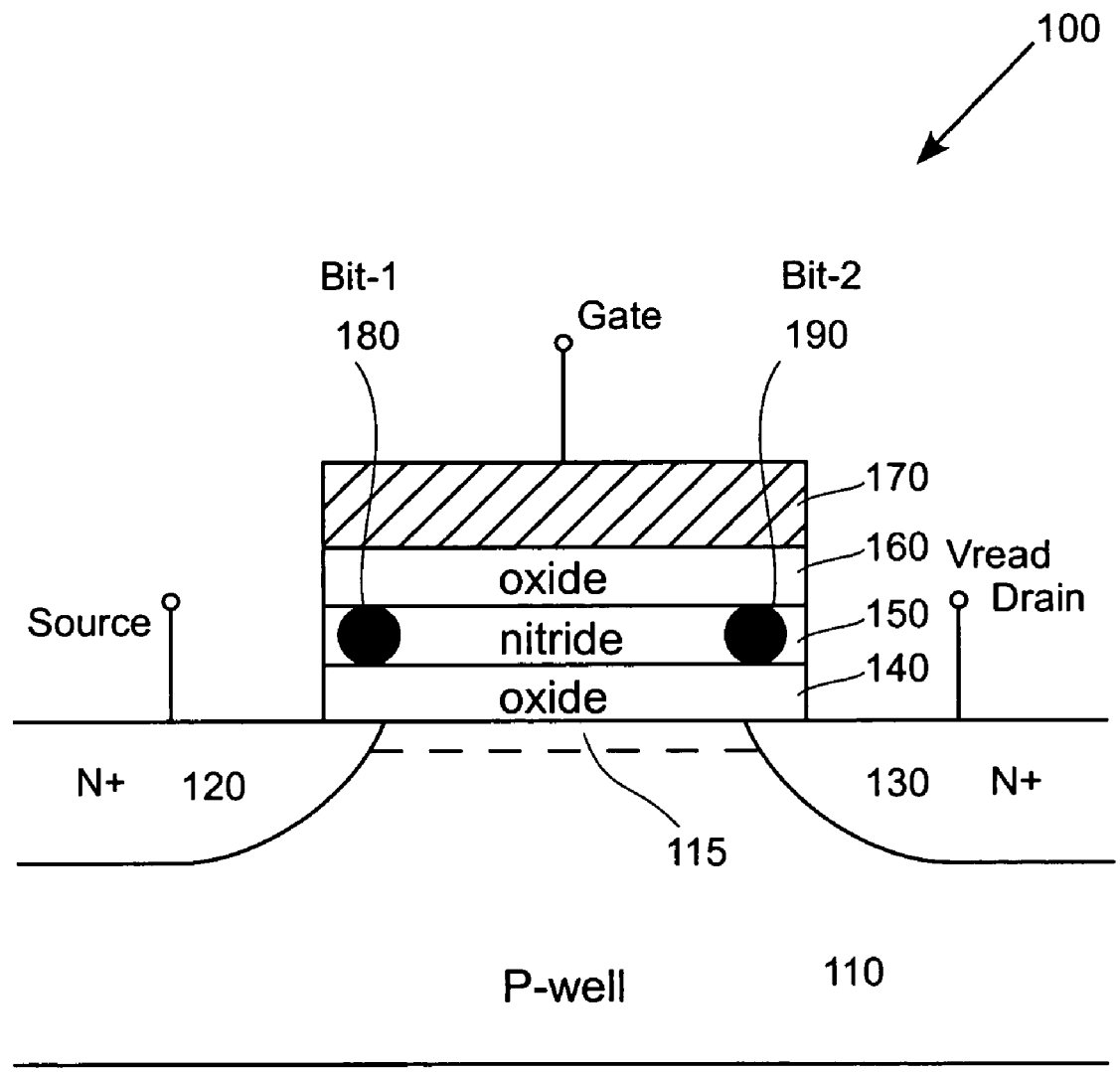
FIG. 1 shows a cross-sectional view of a conventional floating gate Nitride Read Only Memory (NROM) cell with two bits operation capability.
Figure 2:
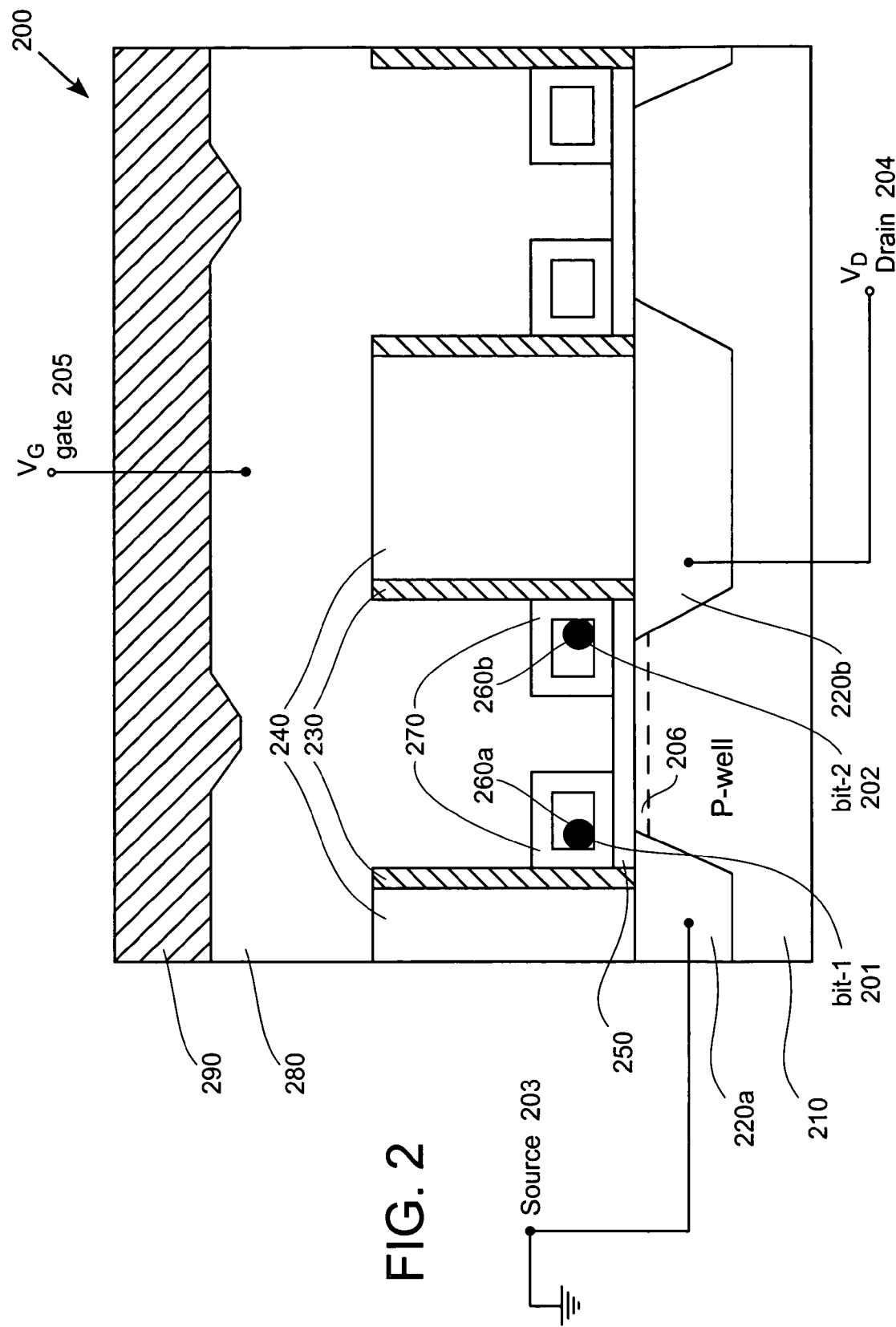
FIG. 2 shows a cross-sectional view of a Quantum-wire memory device (QWMD) in accordance with one embodiment of the present invention.

Referring first to FIG. 2, a cross-sectional view of a Quantum-wire memory device (QWMD) 200 is shown to illustrate how the drain coupling helps to suppress the second bit effect in accordance with one embodiment of the present invention.

As shown in FIG. 2, the QWMD 200 includes a P-well substrate 210 and two source-drain junctions 220a and 220b. Two oxide regions 240 along with adjacent two silicon nitride spacers 230 are disposed over the two source-drain junctions 220a and 220b, respectively. In an alternative embodiment, the silicon nitride spacers 230 can be replaced by oxide spacers. A tunnel oxide layer 250 is formed on the surface of the P-well substrate between the two silicon nitride spacers 230. Floating gates 260a and 260b, also known as quantum wires, have a layer of a sidewall oxide layer 270. The floating gates 260a and 260b are preferably disposed adjacent to the silicon nitride spacers 230 with an overlap over the source-drain junctions 220a and 220b, respectively. A polysilicon gate 280 excessively fills the trench formed by the oxide regions 240, the silicon nitride spacers 230, the sidewall oxides 270, and the tunnel oxide layer 250. In one embodiment, a silicide layer may be disposed over the polysilicon gate 280. The terminals 203, 204, and 205 are connected with the source-drain junctions 220a, 220b, and the polysilicon gate 280, respectively. Fabricated contacts and interconnects will typically define the connections of terminals 203, 204, and 205. When a charge is applied to the gate terminal 205, a channel 206 can be formed under the tunnel oxide layer 250 and between the source-drain junctions 220a and 220b.

The floating gates 260a and 260b can be programmed by channel hot electron (CHE) injection, or the source/drain side Fowler-Nordheim or Band-to-Band hot hole injection. The charge stored in the floating gate 260a is considered as the bit-1 201, and the charge stored in the floating gate 260b is considered as the bit-2 202. During a reverse read operation of the QWMD 200 for the bit-1 201, the source-drain junction 220a functions as the source and the source-drain junction 220b functions as the drain. A gate voltage $V_G$=about 3 V and a drain voltage, i.e., the read voltage, $V_D$=about 1.6V are applied to the gate terminal 205 and the drain terminal 204, respectively. The source terminal 203 is grounded.

As well known in the art, the sum of all coupling coefficients should be equal to 1, i.e., $\alpha_G+\alpha_D+\alpha_B+\alpha_S=1$, where $\alpha_G$, $\alpha_D$, $\alpha_B$, and $\alpha_S$ are the coupling coefficients for the control gate, drain, substrate, and source, respectively. Since the QWMD 200 has split floating gate structure, the source coupling coefficient $\alpha_S$=0. As an example, the drain coupling coefficient may be $\alpha_D$=about 0.2 to about 0.3. As a result, the coupled gate voltage to the floating gate 260b is about 1.6V×$\alpha_D$≈about 0.3V to about 0.5V. In accordance with one embodiment of the invention, this additional coupled gate voltage will therefore help to screen out the barrier created by the bit-2 202 if the bit-2 202 is at high threshold state. With the help of drain deplete and drain induced barrier lowering (DIBL), the barrier created by bit-2 can be almost completely eliminated by this drain coupling effect during a reverse read operation for the bit-1 201.

The coupled gate voltage due to the drain coupling can pull the inversion channel upward and restore the sub-threshold swing. The recovered sub-threshold swing helps to improve the memory device performance.

Figure 3:
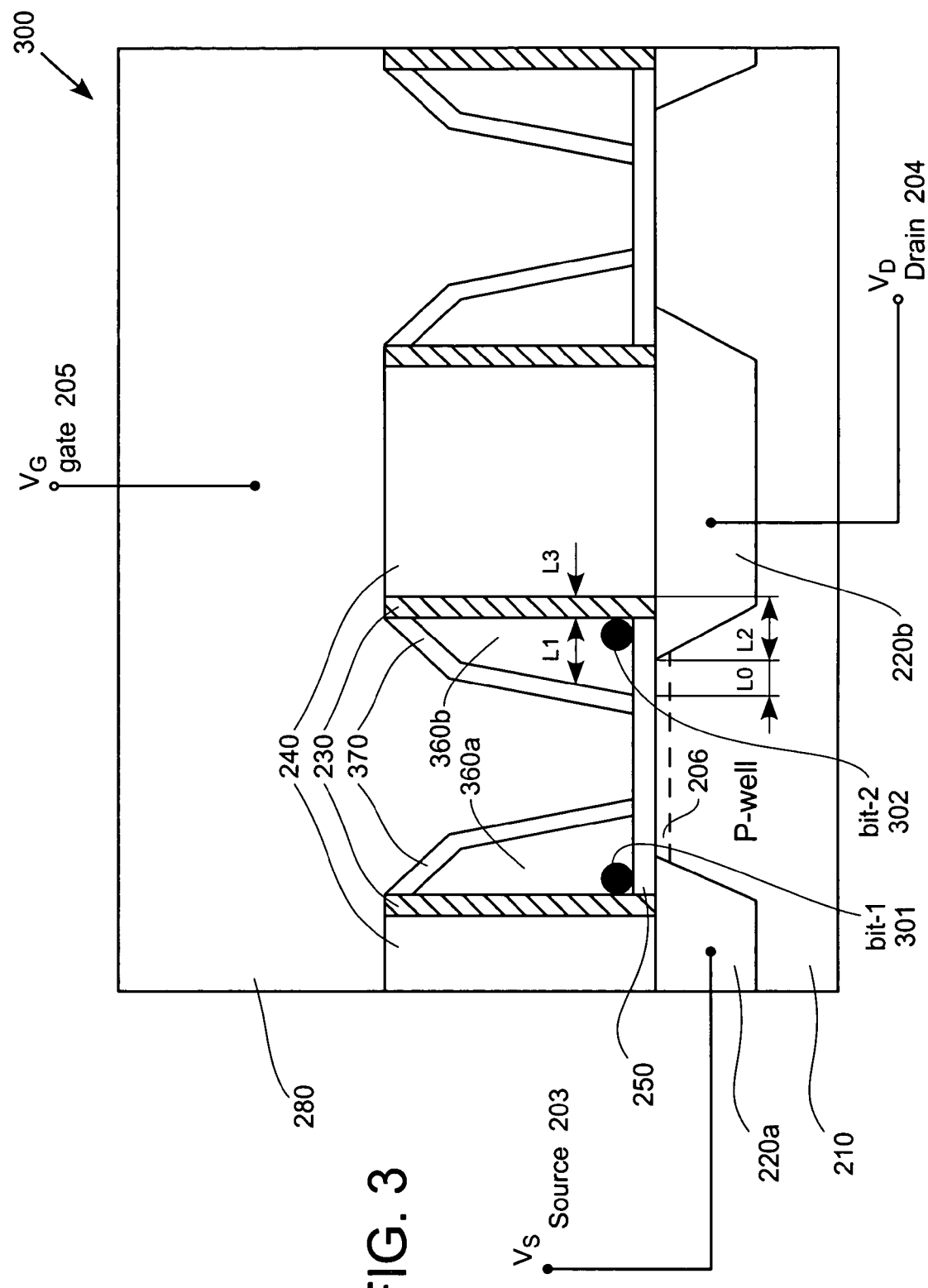
FIG. 3 shows a cross-sectional view of a poly-spacer floating gate device in accordance with one embodiment of the present invention.

Referring now to FIG. 3, a cross-sectional view of a poly-spacer (i.e., polysilicon spacer) floating gate device 300 is shown to illustrate how to suitably design the drain and gate overlap region $L_D$ in order to use the drain coupling to suppress the second bit effect in accordance with one embodiment of the present invention.

The illustrated poly-spacer floating gate device 300 has a P-well substrate 210 and two source-drain junctions 220a and 220b. Two oxide regions 240 along with the adjacent two silicon nitride spacers 230 are disposed over the two source-drain junctions 220a and 220b, respectively. As noted above, the silicon nitride spacers 230 may be replaced by oxide spacers. A tunnel oxide layer 250 is formed on the surface of the P-well substrate 210 between the two silicon nitride spacers 230. Two poly spacers, i.e., the floating gates 360a and 360b, are each covered by an oxide layer 370, and are disposed adjacent to the silicon nitride spacers 230 with an overlap over the source-drain junctions 220a and 220b, respectively. A polysilicon gate 280 fills the trench formed by the oxide regions 240, the silicon nitride spacers 230, the oxide layers 370, and the tunnel oxide layer 250. The terminals 203, 204, and 205 are connected with the source-drain junctions 220a, 220b, and the polysilicon gate 280, respectively. The terminals 203, 204, and 205 are connected with the source-drain junctions 220a, 220b, and the polysilicon gate 280, respectively. Fabricated contacts and interconnects will typically define the connections of terminals 203, 204, and 205. When a charge is applied to the gate terminal 205, a channel 206 can be formed under the tunnel oxide layer 250 and between the source-drain junctions 220a and 220b.

The floating gates 360a and 360b can be programmed by channel hot electron (CHE) injection, or the source/drain side Fowler-Nordheim or Band-to-Band hot hole injection. The charge stored at the floating gate 360a is bit-1 301 and the charge stored at the floating gate 360b is bit-2 302. When the bit-1 301 is read during a reverse read operation, the source-drain junctions 220a and 220b function as the source and the drain, respectively. $V_S$ is the source voltage applied to the source terminal 203, $V_D$ is the drain voltage applied to the drain terminal 204, and $V_G$ is the gate voltage applied to the gate terminal 205.

By suitably design of the poly spacer 360b width $L_1$, the silicon nitride spacer 230 width $L_3$, and the diffusion length of implantation $L_2$, the drain and gate overlap region $L_D$, where $L_D=L_1+L_3-L_2$, can be controlled so that a desired degree of drain coupling of the device 300 can be used to suppress the second bit effect during the reverse read operation.

Increasing the drain coupling coefficient will also reduce the gate and substrate coupling coefficients. The reduced gate coupling coefficient will reduce the carrier injection efficiency while the reduced substrate coupling coefficient will reduce the channel control capability. Therefore, certain trade-offs and device optimizations can be made when selecting the overlap amount.

For purposes of example, for a 0.25 micron technology embodiment, the overlap ($L_D$) can be selected to be between about 0.01 micron and about 0.1 micron, and more preferably, between about 0.03 micron and about 0.08 micron, and in a specific embodiment the overlap can be about 0.06 microns. Of course, for other micron technologies or smaller technologies (e.g., namometer technologies), the dimensions will change accordingly.

In one embodiment of the present invention, when reading the bit-1 301 during a reverse read operation, the modified reverse read scheme, i.e., the "raised source voltage $V_S$" scheme, can be used to further improve the drain coupling effect by increasing the drain voltage $V_D$. In this embodiment, the source-drain junctions 220a, 220b and the polysilicon gate 280 function as the source, drain, and the gate, respectively. Instead of grounding the source terminal 203 during a reverse read for the bit-1 301, a small source voltage $V_S=0.2V$ can be applied to the source terminal 203. Raising the source voltage can avoid read disturb. As a result, the drain voltage, i.e., the read voltage, $V_D$ can also be increased. The increased read voltage $V_D$ results in increased coupled gate voltage; therefore, the drain coupling effect is further improved.

For a localized split floating gate device, the drain coupling effect not only suppresses the second bit effect during a reverse read operation, but also improves CHE injection efficiency. For example, during a CHE injection programming, the following exemplary voltages can be applied to the gate voltage $V_G$=about 10V and the drain voltage, i.e., the read voltage, $V_D$=about 6V. If the drain coupling coefficient is, for example, $\alpha_D$=about 0.2 to about 0.3, the coupled gate voltage during CHE programming would be about 1V to about 2V. The increased gate voltage of the floating gate will increase the CHE injection efficiency even with a smaller control gate voltage.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A localized split floating gate device, comprising:
   a substrate having a first source-drain junction and a second source-drain junction;
   a first oxide region defined over the first source-drain junction and a second oxide region defined over the second source-drain junction;
   a first floating gate defined with an overlap over the first source-drain junction and adjacent to the first oxide region, the overlap capable of establishing a degree of drain coupling when the first source-drain junction is wired as a drain; and
   a second floating gate defined with an overlap over the second source-drain junction and adjacent to the second oxide region, the overlap capable of establishing a degree of drain coupling when the second source-drain junction is wired as a drain.

2. A localized split floating gate device as recited in claim 1, further comprising a spacer on either side of the first oxide region, the spacer assisting in defining an amount of the overlap.

3. A localized split floating gate device as recited in claim 2, wherein the spacer is a silicon nitride spacer.

4. A localized split floating gate device as recited in claim 2, wherein the spacer is an oxide spacer.

5. A localized split floating gate device as recited in claim 1, further comprising a spacer on either side of the second oxide region, the spacer assisting in defining an amount of the overlap.

6. A localized split floating gate device as recited in claim 5, wherein the spacer is a silicon nitride spacer.

7. A localized split floating gate device as recited in claim 5, wherein the spacer is an oxide spacer.

8. A localized split floating gate device as recited in claim 1, further comprising:
   an oxide layer over the first and second floating gates;
   a tunnel oxide layer defined over the substrate; and
   a polysilicon gate defined between the first floating gate, the second floating gate, and over the tunnel oxide layer, wherein a channel is defined in the substrate under the tunnel oxide layer.

9. A localized split floating gate device as recited in claim 1, wherein when the first source-drain junction is a drain, the second floating gate stores a first bit, and the first floating gate experiences the degree of drain coupling to suppress a second bit effect.

10. A localized split floating gate device as recited in claim 1, wherein the overlap ranges between about 0.01 micron and about 0.1 micron.

11. A localized split floating gate device as recited in claim 1, wherein the overlap ranges between about 0.03 micron and about 0.08 micron.

12. A localized split floating gate device as recited in claim 1, wherein the overlap is about 0.06 micron.

13. A localized split floating gate device, comprising:
   a drain junction defined in a substrate;
   an oxide region defined over a center region of the drain junction; and
   a floating gate defined adjacent to the oxide region, the floating gate defined with an overlap over the drain junction, the overlap capable of establishing a degree of drain coupling to suppress a reverse read second bit effect.

14. A localized split floating gate device as recited in claim 13, further comprising a spacer on either side of the oxide region, the spacer assisting in defining an amount of the overlap.

15. A localized split floating gate device as recited in claim 14, wherein the spacer is a silicon nitride spacer.

16. A localized split floating gate device as recited in claim 14, wherein the spacer is an oxide spacer.

17. A localized split floating gate device as recited in claim 13, further comprising:
   an oxide layer over the floating gate;
   a tunnel oxide layer defined over the substrate; and
   a polysilicon gate defined over the tunnel oxide layer and the oxide layer.

18. A localized split floating gate device as recited in claim 13, wherein the floating gate experiences a degree of drain coupling to suppress a second bit effect.

19. A localized split floating gate device as recited in claim 13, wherein the overlap ranges between about 0.01 micron and about 0.1 micron.

20. A localized split floating gate device as recited in claim 13, wherein the overlap ranges between about 0.03 microns and about 0.08 micron.

21. A localized split floating gate device as recited in claim 13, wherein the overlap is about 0.06 micron.

* * * * *